US012107184B2

(12) United States Patent
Lin et al.

(10) Patent No.: US 12,107,184 B2
(45) Date of Patent: Oct. 1, 2024

(54) PATTERNED SUBSTRATE, EPITAXIAL WAFER, MANUFACTURING METHOD, STORAGE MEDIUM AND LED CHIP

(71) Applicant: KONKA GROUP CO., LTD., Shenzhen (CN)

(72) Inventors: Weihan Lin, Shenzhen (CN); Meihui Yang, Shenzhen (CN)

(73) Assignee: KONKA GROUP CO., LTD. (CN)

(*) Notice: Subject to any disclaimer, the term of this patent is extended or adjusted under 35 U.S.C. 154(b) by 444 days.

(21) Appl. No.: 17/613,762

(22) PCT Filed: Jun. 27, 2019

(86) PCT No.: PCT/CN2019/093260
§ 371 (c)(1),
(2) Date: Nov. 23, 2021

(87) PCT Pub. No.: WO2020/237767
PCT Pub. Date: Dec. 3, 2020

(65) Prior Publication Data
US 2022/0231187 A1 Jul. 21, 2022

(30) Foreign Application Priority Data
May 24, 2019 (CN) .......................... 201910441026.2

(51) Int. Cl.
*H01L 33/00* (2010.01)
(52) U.S. Cl.
CPC ................. *H01L 33/0075* (2013.01)
(58) Field of Classification Search
None
See application file for complete search history.

(56) References Cited

U.S. PATENT DOCUMENTS

| 5,208,821 A | * | 5/1993 | Berger | H01S 5/227 |
| | | | | 372/45.01 |
| 5,614,019 A | * | 3/1997 | Vichr | C30B 29/36 |
| | | | | 117/84 |

(Continued)

FOREIGN PATENT DOCUMENTS

| CN | 1588640 | 3/2005 | ............. H01L 21/84 |
| CN | 1632186 | 6/2005 | ............. C30B 25/02 |

(Continued)

OTHER PUBLICATIONS

Machine Translation of CN 102856451 A, dated Jan. 2, 2013 (Peng) (Year: 2013).*
International Search Report and Written Opinion issued in PCT/CN2019/093260, with English translation, dated Feb. 27, 2020, 12 pgs.

(Continued)

*Primary Examiner* — Scott B Geyer
(74) *Attorney, Agent, or Firm* — HAYES SOLOWAY P.C.

(57) ABSTRACT

The present disclosure relates to a patterned substrate, an epitaxial wafer, a manufacturing method, a storage medium and an LED chip. The patterned substrate is applied to a Micro LED, a substrate body of the patterned substrate is provided with at least one receiving groove capable of receiving at least part epitaxial material dropped during an epitaxial process. At least part excess epitaxial material produced during a high-speed rotational molding process of an epitaxial layer in an MOCVD furnace may drop into the receiving groove and not remain on the epitaxial layer.

9 Claims, 2 Drawing Sheets

(56) References Cited

U.S. PATENT DOCUMENTS

| | | | |
|---|---|---|---|
| 6,940,098 B1* | 9/2005 | Tadatomo | C30B 25/183 |
| | | | 257/190 |
| 7,589,001 B2* | 9/2009 | Tadatomo | H01L 21/0237 |
| | | | 438/481 |
| 9,318,326 B2* | 4/2016 | Von Kanel | H01L 21/02381 |
| 10,995,403 B2* | 5/2021 | Ichiraku | H01L 21/02656 |
| 2004/0123796 A1* | 7/2004 | Nagai | H01L 21/02639 |
| | | | 257/E21.127 |
| 2004/0144301 A1* | 7/2004 | Neudeck | C30B 25/18 |
| | | | 117/86 |
| 2004/0152321 A1* | 8/2004 | Gehrke | H01L 21/0242 |
| | | | 438/689 |
| 2005/0183658 A1* | 8/2005 | Nakahata | C30B 25/02 |
| | | | 117/2 |
| 2006/0270201 A1* | 11/2006 | Chua | C30B 29/403 |
| | | | 257/E21.124 |
| 2008/0171424 A1* | 7/2008 | Li | H01L 21/0245 |
| | | | 257/E21.127 |
| 2010/0065854 A1* | 3/2010 | Kamber | H01L 21/02639 |
| | | | 257/E29.089 |
| 2010/0112749 A1* | 5/2010 | Park | H01L 21/02282 |
| | | | 438/692 |
| 2010/0123118 A1 | 5/2010 | Hu et al. | H01L 33/00 |
| 2017/0067182 A1* | 3/2017 | Shibata | H01L 21/02598 |
| 2017/0154903 A1* | 6/2017 | Dykaar | H01L 27/1218 |
| 2019/0148586 A1* | 5/2019 | Zhang | H01L 33/44 |
| | | | 257/13 |
| 2019/0390330 A1* | 12/2019 | Ichiraku | H01L 33/56 |

FOREIGN PATENT DOCUMENTS

| | | | | |
|---|---|---|---|---|
| CN | 1953220 A | * | 4/2007 | ............ H01L 33/00 |
| CN | 101740677 | | 6/2010 | ............ H01L 33/00 |
| CN | 101820041 | | 9/2010 | ............ H01L 33/12 |
| CN | 102034907 | | 4/2011 | ............ H01L 33/00 |
| CN | 102856451 | | 1/2013 | ............ H01L 33/02 |
| CN | 103050596 | | 4/2013 | ............ H01L 33/20 |
| CN | 203085624 U | * | 7/2013 | ............ H01L 33/02 |
| CN | 103682016 | | 3/2014 | ............ H01L 33/32 |
| CN | 104269481 | | 1/2015 | ............ H01L 33/20 |
| CN | 105047537 | | 11/2015 | ............ H01L 21/02 |
| CN | 105895585 A | * | 8/2016 | ....... H01L 21/02381 |
| CN | 106350783 | | 1/2017 | ............ C23C 16/44 |
| CN | 106784194 | | 5/2017 | ............ H01L 33/00 |
| CN | 108269887 | | 7/2018 | ............ H01L 33/00 |
| CN | 108598236 | | 9/2018 | ............ H01L 33/00 |
| CN | 109360871 | | 2/2019 | ............ H01L 33/00 |
| CN | 109478493 | | 3/2019 | ............ H01L 21/02 |
| WO | WO-2015159342 A1 | * | 10/2015 | ............ C23C 16/01 |
| WO | WO-2015193955 A1 | * | 12/2015 | ............ C23C 16/34 |

OTHER PUBLICATIONS

International Preliminary Report on Patentability issued in PCT/CN2019/093260, dated Nov. 16, 2021, 4 pages.

First Office Action issued in Chinese Patent Appln. Serial No. 201910441026.2, dated Dec. 31, 2019, with English translation, 13 pages.

* cited by examiner

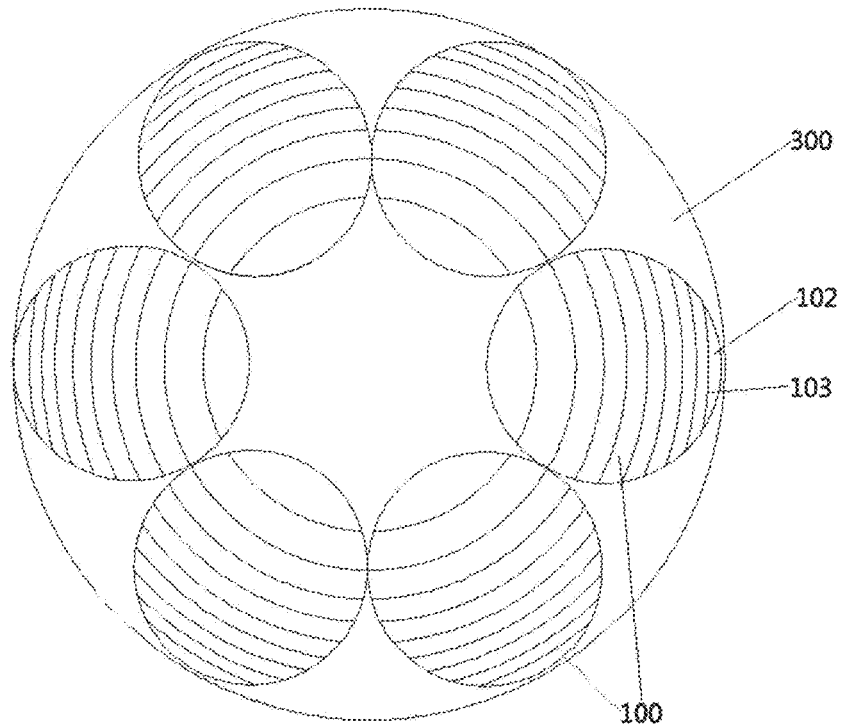

FIG.3

```
┌─────────────────────────────────────────────────────┐
│ Processing, according to a preset patterning process, the receiving │── S100
│ groove on the buffer layer on the upper surface of the substrate body │
│ to form the patterned substrate                     │
└─────────────────────────────────────────────────────┘
                          │
                          ▼
┌─────────────────────────────────────────────────────┐
│ Loading the patterned substrate on the carrier in the MOCVD │── S200
│ furnace, and processing the patterned substrate to generate an │
│ epitaxial layer                                     │
└─────────────────────────────────────────────────────┘
```

FIG.4

PATTERNED SUBSTRATE, EPITAXIAL WAFER, MANUFACTURING METHOD, STORAGE MEDIUM AND LED CHIP

CROSS-REFERENCES TO RELATED APPLICATIONS

This application is a national stage application of PCT Patent Application No.PCT/CN2019/093260, filed on Jun. 27, 2019, which claims priority to Chinese Patent application Ser. No. 201910441026.2, filed on May 24, 2019, the content of all of which is incorporated herein by reference.

FIELD OF THE DISCLOSURE

The present disclosure relates to the field of LED technology, in particular, to a patterned substrate, an epitaxial wafer, a manufacturing method, a storage medium and an LED chip.

BACKGROUND

Micro LED (Micro Light-Emitting Diode) technology, that is, miniaturization and matrixing technology of LED, refers to integrate LED arrays with high-density and small-size on a chip; each pixel of the LED display can be addressed and individually driven to light up, Micro LED display can be regarded as a miniature version of the outdoor LED display that reduces a distance between pixels from millimeters to micrometers.

Micro LED has many advantages. It has the advantages of inorganic LEDs such as high efficiency, high brightness, high reliability and fast response time. It also has the characteristics of self-luminescence without a backlight, and further has the advantages of energy saving, small size, and simple mechanism.

Generally, the manufacturing method of the Micro LED display is as follows: firstly grow LED micro-devices on a sapphire (or others such as SiC, Si, etc.) substrate by molecular beam epitaxy, and then transfer the LED micro-devices to a glass substrate. Since the size of the sapphire substrate for growing LED micro-devices is basically the size of a silicon wafer, while the size of the glass substrate for making the display is much larger, the transfer needs to occur multiple times. Therefore, the core technology of Micro LED is the transfer of nano-scale LED, not the technology of manufacturing LED. But the manufacturing technology will also affect subsequent transfers. For example, to facilitate the transfer of large quantities and improve the quality, the wavelength uniformity of the epitaxial wafer applied in Micro LED is required to be within 1 nm, while the present process can only achieve about 3 nm.

The LED epitaxial wafer is loaded with a substrate in a MOCVD (Metal Organic Chemical Vapor Deposition) furnace, and rotated at a high speed in the chamber, using trimethylgallium sources such as TMGa and nitrogen as Ga source and N source respectively, and using ultrapure hydrogen as the carrier gas, a ternary or quaternary GaN semiconductor layer is epitaxially grown on the substrate.

To ensure the epitaxial layer of each substrate in the chamber to be uniform, each substrate keeps rotating during the growth of the epitaxial layer, but the constant rotation may lead to uneven thickness on the single epitaxial layer due to centrifugal force. The uneven thickness of the epitaxial layer will at least results in uneven wavelength.

Therefore, the existing technology still needs to be improved and developed.

BRIEF SUMMARY OF THE DISCLOSURE

In view of the defects of the above prior art, the present disclosure provides a patterned substrate, an epitaxial wafer, a manufacturing method, a storage medium and an LED chip, aiming to solve the problem in the prior art that the thickness of an epitaxial layer is uneven due to the high-speed rotation of the LED epitaxial wafer in the MOCVD furnace, which may lead to uneven wavelength.

The technical scheme of the present disclosure is as follows:

A patterned substrate applied to Micro LED, the patterned substrate comprises a substrate body which is provided with at least one receiving groove, the receiving groove receives at least part of an epitaxial material dropped during an epitaxial process.

Further, the receiving groove comprises a first groove body in a shape of a fan ring, when the patterned substrate is placed in a designated position of a MOCVD carrier, an axis of the first groove body is coincided with an axis of the carrier.

Further, a plurality of receiving grooves are provided in the patterned substrate, and the plurality of receiving grooves are arranged in sequence along a center line of the substrate body, and a density of the arrangement decreases from one end to another end.

Further, a plurality of supporting pillars are provided on the substrate body, and each receiving groove is formed between every two adjacent supporting pillars.

Further, a buffer layer is arranged on an upper surface of the substrate body, and the receiving groove is formed in the buffer layer.

The present disclosure also provides an epitaxial board which comprises the patterned substrate as described above, the epitaxial board further comprises: an epitaxial layer, and the containing groove is formed between the epitaxial layer and the patterned substrate.

The present disclosure also provides a method for manufacturing the epitaxial wafer as described above, the manufacturing method includes the steps:

processing, according to a preset patterning process, the receiving groove on the substrate body or the buffer layer on the upper surface of the substrate body to form the patterned substrate;

loading the patterned substrate on the carrier in the MOCVD furnace, and processing the patterned substrate to generate an epitaxial layer.

The present disclosure also provides a storage medium in which a computer program is stored, and when the computer program is executed by a processor, the steps of the above-mentioned manufacturing method are implemented.

The present disclosure also provides a LED chip, the LED chip comprises the substrate patterned as described above.

Compared with the prior art, the patterned substrate provided by the present disclosure has at least one receiving groove arranged on the substrate body, the receiving groove is capable of receiving at least part of the epitaxial material dropped during the epitaxial process, so that at least part of the excess epitaxial material generated during the process of forming the epitaxial layer by rotating the patterned substrate in high-speed in the MOCVD furnace can fall into the receiving groove without being remained on the epitaxial layer, which improves the problem of uneven thickness of the epitaxial layer, thereby increasing the uniformity of wavelength, that is, the patterned substrate provided by the present disclosure at least solves the problem of uneven wavelength.

BRIEF DESCRIPTION OF THE DRAWINGS

FIG. 3 is a top view of the patterned substrate placed in the MOCVD chamber in an embodiment of the present disclosure.

FIG. 4 is a flowchart of a method for manufacturing an epitaxial wafer in an embodiment of the present disclosure.

DETAILED DESCRIPTION OF EMBODIMENTS

In order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the present disclosure.

Figure 1:
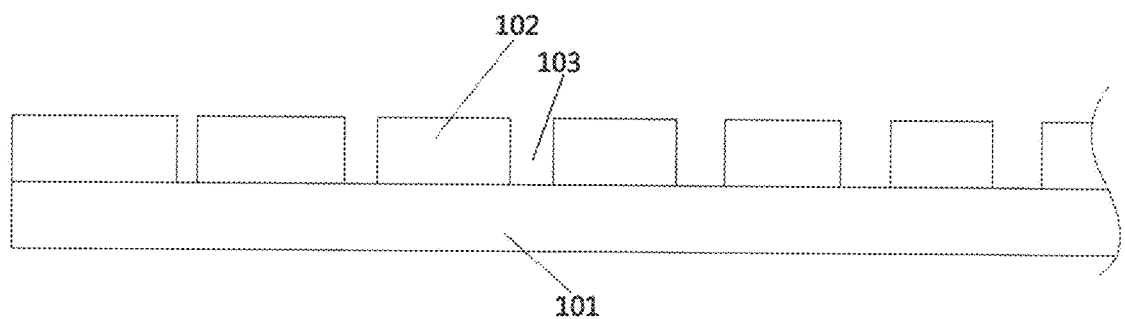
FIG. 1 is a schematic structural diagram of a patterned substrate in an embodiment of the present disclosure.
Figure 2:
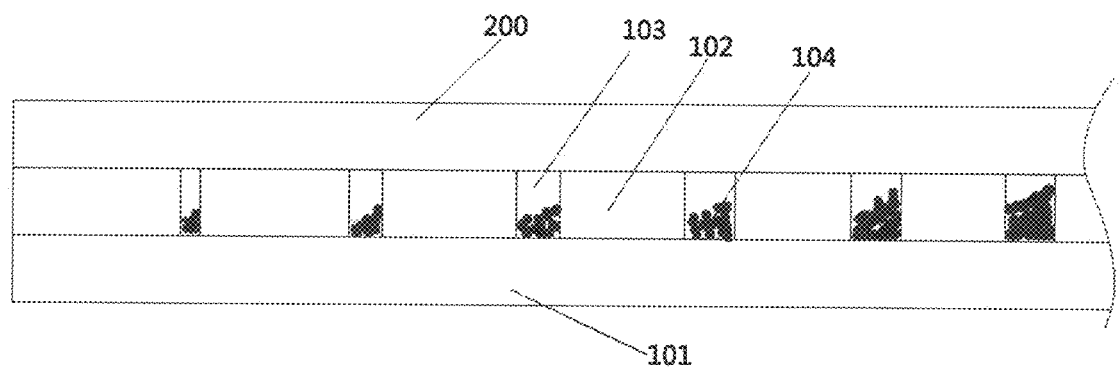
FIG. 2 is a schematic structural diagram of an epitaxial wafer in an embodiment of the present disclosure.

A patterned substrate 100 provided by the present disclosure (in FIG. 3, 300 represents a carrier in the MOCVD, and the six circles placed on a carrier 300 represent the patterned substrate 100. It should be understood that the number of patterned substrates 100 that the carrier 300 shall receive may be increased or decreased, is not limited to six), which is applied to Micro LED, as shown in FIG. 1, FIG. 2 and FIG. 3, includes a substrate body 101. At least one receiving groove 103 is arranged above the substrate body 101. The receiving groove 103 has a function of receiving excess epitaxial material 104 generated during the forming process of an epitaxial layer 200, that is, if the epitaxial layer 200 is formed by the MOCVD furnace, there will be excess epitaxial material 104 thrown out from a plane where the to be formed epitaxial layer 200 is located when the patterned substrate 100 rotates in a high-speed with the MOCVD furnace. If the receiving groove 103 is not provided, the epitaxial material 104 thrown out may adhere to the to be formed epitaxial layer 200, which may eventually result in uneven thickness of the surface of the epitaxial layer 200. When the receiving groove 103 is provided, part or all of the epitaxial material 104 thrown out will fall into the receiving groove 103, so that the problem of uneven thickness of the single epitaxial layer 200 is solved, and the problem of uneven wavelength is solved.

In an embodiment, the receiving groove 103 is selectively completed by a photolithography process, so that the receiving groove 103 may be formed on the patterned substrate 100 according to a preset position to ensure a performance of the epitaxial wafer and the LED chip after manufacturing.

As an embodiment of the present disclosure, a plurality of receiving grooves 103 are provided along a center line of the substrate body 101 (the center line here means any straight line that may divide the substrate body 101 into two symmetrical semicircles) in sequence, that is, the plurality of receiving grooves 103 are arranged in sequence from one end of the substrate body 101 to another end of the substrate body. Further, a density of the arrangement of the plurality of receiving grooves 103 decreases gradually from one end to the other end. Further, when the patterned substrate 100 is placed in the MOCVD, the end where the receiving grooves 103 are arranged with a lower density is close to a center of the carrier 300, and the other end is away from the center of the carrier 300. The centrifugal force becomes greater when away from an axis of the carrier 300, when the patterned substrate 100 is placed in the MOCVD to form the epitaxial layer 200, the greater the density of the receiving groove 103, the more epitaxial material can be received, so that the thickness of the formed epitaxial layer shows a higher uniformity, and the wavelength uniformity is better.

The upper surface of the patterned substrate 100 is provided with a plurality of supporting pillars 102, and each receiving groove 103 is formed between every two supporting pillars 102. Further, the supporting pillars 102 are in a shape of a fan ring. It should be noted that there is no limitation on whether each receiving groove 103 is connected or not, that is, adjacent receiving grooves 103 may be connected or disconnected.

Further, the receiving groove 103 includes a first groove body in a shape of a fan ring. When the patterned substrate 100 is placed at a designated position of the carrier 300, an axis of the first groove body is coincided with an axis of the carrier 300. In other words, the receiving groove 103 itself is in the shape of a fan ring, or at least a part of it is in the shape of a fan ring, so as to adapt to a throwing law of the epitaxial material, and further improve the receiving capacity of the epitaxial material for the receiving groove 103.

Further, a buffer layer is arranged on the upper surface of the patterned substrate 100, and the receiving groove 103 is formed in the buffer layer. A lattice constant of the material of the supporting pillars 102 matches a lattice constant of the substrate. Nitride doped material or silicon-based doped material similar to the material of the buffer layer may be used in the material of the supporting pillars.

The present disclosure also provides an epitaxial wafer, which includes the patterned substrate 100 as described above, and the epitaxial layer 200 formed on the patterned substrate 100, as shown in FIG. 2. From the comparison of FIG. 1 and FIG. 2, before the patterned substrate 100 is placed in the MOCVD furnace, there is no epitaxial material 104 in the receiving groove 103; while after the epitaxial layer 200 is formed, the epitaxial material 104 remains in the receiving groove 10. Therefore, disassembling the epitaxial wafer to check whether the receiving groove 103 has epitaxial material 104 may identify whether the epitaxial wafer is made by the method provided by the present disclosure.

As shown in FIG. 3, a plurality of patterned substrates 100 are respectively placed on the carrier 300 according to a certain rule, then the carrier 300 is placed in the MOCVD chamber, and then the epitaxial layer 200 is grown in the MOCVD chamber as shown in FIG. 2. The receiving groove 103 is annularly arranged on the substrate body 101 from a top view direction, and a center of the annular of the receiving groove 103 is coincided with a center of the carrier 300 in the MOCVD chamber. In this way, during the epitaxial growth process, each substrate 100 rotates with the carrier 300 at a high speed, and the centrifugal force generated by the rotation causes the material of the epitaxial layer 200 to expand to the edge, and the excess epitaxial material 104 falls in the annular receiving grooves 103 during the expansion process, which leads to the thickness distribution and flatness of the epitaxial growth layer on the substrate are made uniform. After the growth is completed, the epitaxial wafer is then processed with a chip segment process to produce a special chip for Micro-LED.

A groove distribution shape of a pattern structure layer on the substrate surface is a concentric ring centered on the center of the MOCVD chamber, and the radius of the concentric rings are arranged at unequal intervals, the receiving grooves 103 of each substrate are arranged in a way that the density gradually increases along a normal direction from the center of the chamber to the outer side.

For the epitaxial wafer provided by the embodiment of the present disclosure, the material thickness and flatness of the epitaxial layer 200 are uniform, so that the manufactured Micro LED chip has a concentrated wavelength range and uniform brightness and color coordinates. It is conducive to the subsequent massive transfer of Micro-LEDs and improve product efficiency and yield.

As an embodiment of the present disclosure, the epitaxial layer includes: an undoped GaN layer, an N-type doped layer, a current spreading layer, an MQW active region, a P-type AlGaN layer, and a P-type layer. When a current flows, the electrons in the N-type region and the holes in the P-type region enter the MQW active region and recombine, to emit visible light in a desired wavelength range.

As another embodiment of the present disclosure, the epitaxial layer includes: a buffer layer, an undoped GaN layer, an N-type doped layer, a current spreading layer, an MQW active region, a P-type AlGaN layer, and a P-type layer.

It can be understood that the specific structure of the epitaxial layer can form different structures according to the patterned materials on the substrate.

As shown in FIG. 4, the present disclosure also provides a method for manufacturing the epitaxial wafer as described above, and the manufacturing method includes the steps of:

S100. Processing, according to a preset patterning process, the receiving groove on the buffer layer on the upper surface of the substrate body to form the patterned substrate, detailed description refers to the patterned substrate and the epitaxial wafer described in the above mentioned embodiment.

S200. Loading the patterned substrate on the carrier in the MOCVD furnace, and processing the patterned substrate to generate an epitaxial layer, detailed description refers to the patterned substrate and the epitaxial wafer described in the above mentioned embodiment.

The present disclosure also provides an LED chip, the LED chip includes the above-mentioned patterned substrate, and the manufacturing method thereof is as follows:

S100. Processing, according to a preset patterning process, the receiving groove on the buffer layer on the upper surface of the substrate body to form the patterned substrate, detailed description refers to the patterned substrate and the epitaxial wafer described in the above mentioned embodiment.

S200. Loading the patterned substrate on the carrier in the MOCVD furnace, and processing the patterned substrate to generate an epitaxial layer, detailed description refers to the patterned substrate and the epitaxial wafer described in the above mentioned embodiment.

S300. Using the epitaxial wafer after the epitaxial layer is generated, an LED chip is fabricated according to a preset chip manufacturing process. This is the prior art, and the present disclosure will not repeat details here.

The present disclosure also provides a storage medium on which a computer program is stored, when the computer program is executed by a processor, the steps of the above-mentioned epitaxial wafer manufacturing method are implemented.

A person of ordinary skill in the art may understand that all or part of the process of the above-mentioned embodiments can be implemented by instructing relevant hardware through a computer program. The computer program may be stored in a non-volatile computer readable storage and when the computer program is executed, it may include the procedures described in the above-mentioned embodiments. Any reference to memory, storage, database or other media used in the various embodiments provided by the present disclosure may include non-volatile and/or volatile memory. Non-volatile memory may include read-only memory (ROM), programmable ROM (PROM), electrically programmable ROM (EPROM), electrically erasable programmable ROM (EEPROM), or flash memory. Volatile memory may include random access memory (RAM) or external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous chain link (SyNchliNk) DRAM (SLDRAM), memory bus (Rambus) direct RAM (RDRAM), direct memory bus dynamic RAM (DRDRAM), and memory bus dynamic RAM (RDRAM), etc.

The technical features of the above embodiments can be combined in any combination. In order to make the description concise, not all possible combinations of the technical features in the above embodiments are described. However, as long as there is no contradiction in the combination of these technical features, they should be considered as the range described in the specification.

The above-mentioned embodiments only express several embodiments of the present disclosure, and the descriptions are relatively specific and detailed, but they should not be interpreted as limitation of the scope of the present disclosure. It should be pointed out that for those ordinary skilled in the art, several modifications and improvements can be made without departing from the concept of the present disclosure, and these all fall within the protection scope of the present disclosure. Therefore, the protection scope of the patent of the present disclosure should be subject to the appended claims.

What is claimed is:

1. A patterned substrate applied to Micro LED, comprising: a substrate body which is provided with at least one receiving groove, wherein the receiving groove receives at least part of an epitaxial material dropped during an epitaxial process; and a plurality of supporting pillars on the substrate body, wherein each receiving groove is formed between every two adjacent supporting pillars.

2. The patterned substrate according to claim 1, wherein the receiving groove comprises: a first groove body in a shape of a fan ring, when the patterned substrate is placed in a designated position of a Metal Organic Chemical Vapor Deposition (MOCVD) carrier, an axis of the first groove body is coincided with an axis of the carrier.

3. The patterned substrate according to claim 1, wherein a plurality of receiving grooves are provided, and the plurality of receiving grooves are arranged in sequence along a center line of the substrate body, and a density of an arrangement of the plurality of receiving grooves in sequence decreases from one end to another end.

4. The patterned substrate according to claim 1, wherein a buffer layer is arranged on an upper surface of the substrate body, and the receiving groove is formed in the buffer layer.

5. The patterned substrate according to claim 1, wherein the receiving groove is formed by a photolithography process.

6. An LED chip, comprising the patterned substrate according to claim 1.

7. An epitaxial wafer comprising the patterned substrate according to claim 1, wherein the epitaxial wafer further comprising: an epitaxial layer, wherein the receiving groove is formed between the epitaxial layer and the patterned substrate.

8. A manufacturing method of the epitaxial wafer according to claim 7, wherein the manufacturing method comprises steps of:
 processing, according to a preset patterning process, the receiving groove on the substrate body or a buffer layer on an upper surface of the substrate body to form the patterned substrate; and
 loading the patterned substrate on a carrier in a MOCVD furnace, and processing the patterned substrate to generate an epitaxial layer.

9. A storage medium having a computer program stored, wherein the computer program is executed by a processor to implement the steps of the manufacturing method according to claim 8.

* * * * *